United States Patent
Rhoades et al.

(10) Patent No.: US 9,076,261 B2
(45) Date of Patent: Jul. 7, 2015

(54) VIRTUAL DRAFTING TOOLS

(71) Applicant: Siemens Product Lifecycle Management Software Inc., Plano, TX (US)

(72) Inventors: Daren Rhoades, Laguna Hills, CA (US); Thomas James Buchanan, Gernika-Lumo (ES)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 373 days.

(21) Appl. No.: 13/628,389

(22) Filed: Sep. 27, 2012

(65) Prior Publication Data

US 2014/0088926 A1   Mar. 27, 2014

(51) Int. Cl.
*G06F 17/50* (2006.01)
*G06T 11/20* (2006.01)

(52) U.S. Cl.
CPC ............ *G06T 11/20* (2013.01); *G06F 17/5009* (2013.01)

(58) Field of Classification Search
CPC ............................. G06T 11/20; G06T 17/5009
USPC .......................................................... 703/1
See application file for complete search history.

(56) References Cited

U.S. PATENT DOCUMENTS

| 5,572,639 A * | 11/1996 | Gantt ............................ 345/651 |
| 5,798,752 A | 8/1998 | Buxton et al. |
| 2005/0281467 A1 * | 12/2005 | Stahovich ..................... 382/202 |
| 2011/0175821 A1 | 7/2011 | King |
| 2011/0216091 A1 | 9/2011 | Song et al. |

FOREIGN PATENT DOCUMENTS

JP          2010284797 A       12/2010

OTHER PUBLICATIONS

PCT Search Report for PCT/US2013/056816, dated Nov. 25, 2013. (8 pages).

* cited by examiner

*Primary Examiner* — Dwin M Craig

(57) ABSTRACT

Various disclosed embodiments include methods and systems for creating a virtual geometric model. According to disclosed embodiments, a data processing system for creating a virtual geometric model includes at least one processor and a memory connected to the processor. The data processing system is configured to generate a virtual drafting tool and a virtual marking device. The data processing system is configured to position the virtual drafting tool on a page and to position the virtual marking device relative to the virtual drafting tool. The data processing system is configured to draw the geometric model on the page by laying down ink by the virtual marking device using the virtual drafting tool and to store the geometric model in the memory.

23 Claims, 16 Drawing Sheets

STANDARD FRENCH CURVE

INHERITING EXISTING CURVE

CUSTOMIZED FRENCH CURVE

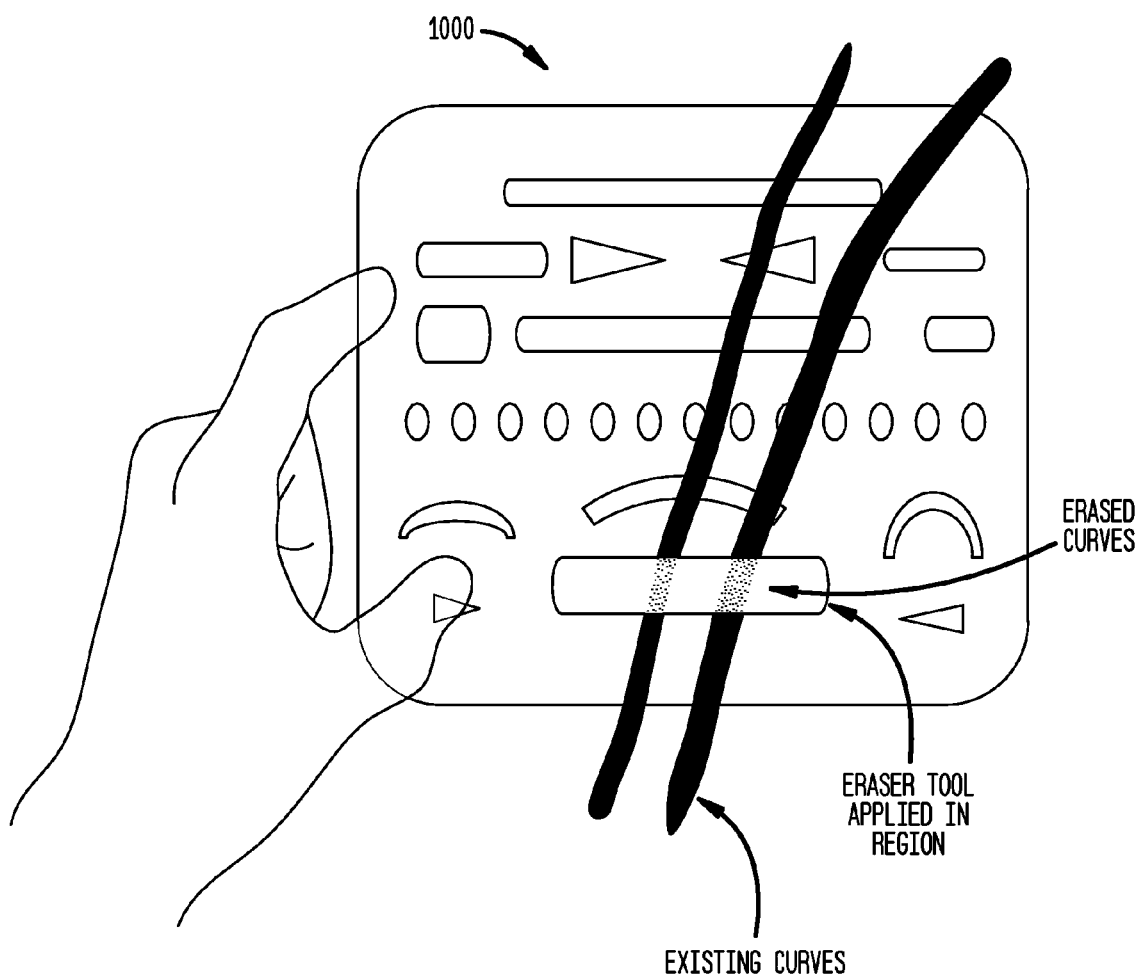

ORIGINAL ENTITY

EXAMPLE REPRESENTATION OF ERASED ENTITY

VIRTUAL DRAFTING TOOLS

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or "PDM" systems).

BACKGROUND OF THE DISCLOSURE

Computer aided design (CAD) systems are used to create virtual models of products. Improved systems are desirable.

SUMMARY OF THE DISCLOSURE

Various disclosed embodiments include methods and system for creating a virtual geometric model using virtual drafting tools. According to disclosed embodiments, a method for creating a virtual geometric model using a computer aided design (CAD) system includes positioning virtual drafting tools and positioning a virtual marking device relative to the virtual drafting tools. The method includes drawing the geometric model by laying down ink by the virtual marking device using virtual drafting tools and storing the geometric model in a memory.

The method includes creating a guide edge along the external edge of the virtual drafting tool, wherein the ink laid down by the virtual marking device follows the guide edge. The method includes creating a masked area bounded by the guide edge, wherein the virtual marking device is prevented from laying down ink under the masked area. The method includes creating an influence band within a predetermined distance from the guide edge, wherein the ink laid down in the influence band is modified to approximate an intended line or a curve.

According to disclosed embodiments, a data processing system for creating a virtual geometric model includes at least one processor and a memory connected to the processor. The data processing system is configured to generate virtual drafting tools and a virtual marking device. The data processing system is configured to position the virtual drafting tools and to position the virtual marking device relative to the virtual drafting tools. The data processing system is configured to draw the geometric model by laying down ink by the virtual marking device using the virtual drafting tools and to store the geometric model in the memory.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 10 illustrates a virtual drafting tool according to disclosed embodiments;

DETAILED DESCRIPTION

Figure 1:
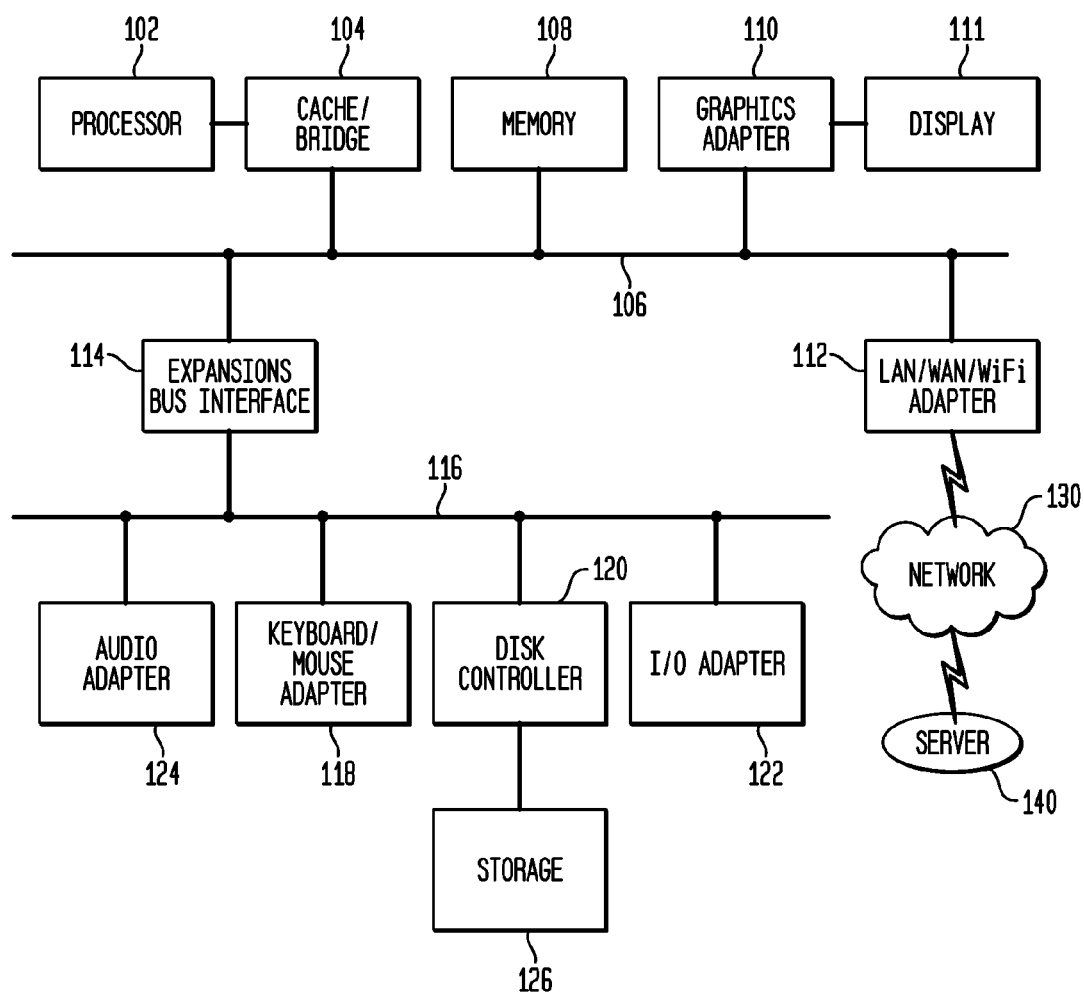
FIG. 1 illustrates a block diagram of a data processing system according to disclosed embodiments.

FIGS. 1 through 16, discussed below, and the various embodiments used to describe the principles of the present disclosure in this patent document are by way of illustration only and should not be construed in any way to limit the scope of the disclosure. Those skilled in the art will recognize that the principles of the present disclosure may be implemented in any suitably arranged device or a system. The numerous innovative teachings of the present disclosure will be described with reference to exemplary non-limiting embodiments Prior to the advent of computer aided design (CAD) systems, designers worked with physical drafting tools such as, for example, T-squares, triangles, symbol templates, and eraser guides. The physical drafting tools were considered obsolete when CAD systems became widely available. However, the physical drafting tools had advantages in the way designers tactically interacted with them in a creative process.

Various disclosed embodiments provide computerized tools with virtual drafting tools that retain advantages of traditional physical drafting tools. The virtual drafting tools allow gesture and tactile interaction and may be manipulated using touch, motion gesture, a stylus device, or a pointing device such as a mouse.

According to disclosed embodiments, the virtual drafting tools recreate artifacts that are part of the traditional physical design experience. When working with a physical pencil or pen, erased curves or lines leave a residual presence, either in the form of residual graphite/ink or indented paper, which may be useful for reworking a design. Unfortunately, such residual presence is unavailable in existing CAD systems. According to disclosed embodiments, visible erased data is provided which mimics residual graphite/ink or indented paper or any representation deemed suitable, such as a particular line font. The visible erased data create a phantom image of erased data. The disclosed embodiments also allow a designer to restore the erased curves or to trace over the curves, which may mitigate the need for an "undo" function in some circumstances. According to disclosed embodiments, residual curves are leveraged through snapping to the curves or vertices, restoring the curves in part or in whole, or creating new ink which duplicates the curve geometry (e.g., tracing).

According to disclosed embodiments, a plurality of virtual drafting tools including virtual drafting boards or tables are provided. The virtual drafting tools mimic traditional physical drafting tools. A user positions a virtual drafting tool on a document. The document may be a virtual canvas or a page. The user may optionally position the virtual drafting tool on a virtual drafting board. However, it will be understood by those skilled in the art that the use of a virtual drafting board is optional, and is not necessary for creating a geometric model. The virtual drafting tool may be oriented relative to a feature of the document (e.g., edge of page), another tool, or on existing curves on the document. Using a virtual marking device such as, for example, a virtual pen or a stylus and the virtual drafting tool, the user lays down ink to create a geometric model of an object on the document.

FIG. 1 depicts a block diagram of data processing system 100 in which an embodiment can be implemented, for example as a PDM system particularly configured by software or otherwise to perform the processes as described herein, and in particular as each one of a plurality of interconnected and communicating systems as described herein. According to disclosed embodiments, system 100 may be implemented as a touch-enabled Tablet computing device such as, for example, an iPAD® Tablet by Apple®. According to other disclosed embodiments, system 100 may be implemented as a multi-touch enabled desktop computing device with a stylus device. According to other disclosed embodiments, system 100 may be implemented as a computing device (e.g., desktop, laptop or Tablet) featuring a gesture recognition system such as, for example, a Kinect® device from Microsoft® Corporation.

The data processing system depicted includes processor 102 connected to level two cache/bridge 104, which is connected in turn to local system bus 106. Local system bus 106 may be, for example, a peripheral component interconnect (PCI) architecture bus. Also connected to local system bus in the depicted example are main memory 108 and graphics adapter 110. Graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc. As discussed before, system 100 may be implemented to support other types of input devices such as, for example, a stylus device. Also, system 100 may be implemented as a touch-enabled computing device or a motion-enabled device such as, for example, a Kinect® device from Microsoft®.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

Data processing system 100 in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button or by touch interaction or gesture, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100. Data processing system 100 may be configured as a workstation, and a plurality of similar workstations may be linked via a communication network to form a distributed system in accordance with embodiments of the disclosure.

Figure 2:
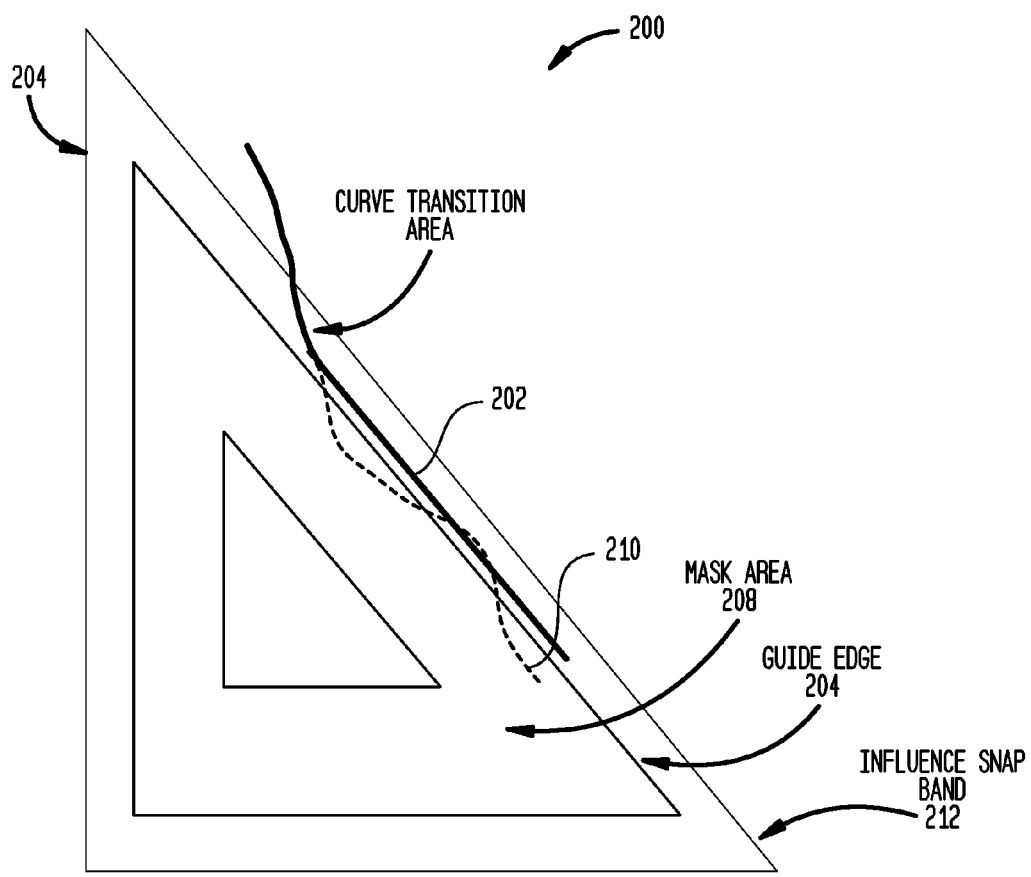
FIG. 2 illustrates a virtual drafting tool according to disclosed embodiments.

According to disclosed embodiments, the virtual drafting tools may feature a guide edge, which may be defined by the external edge of the virtual drafting tool. The guide edge may be straight or curved. FIG. 2 illustrates a virtual drafting tool (e.g., triangle 200) with guide edges 204 according to disclosed embodiments. The area of triangle 200 bounded by guide edges 204 serves as masked area 208. According to disclosed embodiments, when interacting with triangle 200, no entities may be created or deleted under masked area 208.

According to disclosed embodiments, geometries may be created, deleted, and erased by the methods described below.

Laying down ink (pixels) with a stylus or touch/motion gesture: A line may be created by laying down ink collinearly or offset by a specified amount from guide edge 204 (typically to compensate for line thickness) when a stylus or gesture point is within a predetermined tolerance of guide edge 204, which is depicted as influence band 212 in FIG. 2, and can act as a curve transition area. When the stylus point or touch point wavers out of influence band 212 as depicted by stylus path 210, the ink follows the excursion. In order to prevent creating short lines perpendicular to the virtual drafting tool in influence band 212, the curve will be modified in influence band 212 to best approximate the intended approach or excursion based on the user input, for example to produce a line 202. According to disclosed embodiments, ink cannot be laid down under the virtual drafting tool, thus restricting the ink to follow guide edge 204, or to stay outside of the tool area.

Sketch Recognition: According to disclosed embodiments, a sketch recognition function is provided for creating a two-dimensional geometry such as, for example, an analytic curve, from recognized ink. The analytic curve follows the guide edge in the same manner as unrecognized ink.

Laying down analytic curves with a stylus, virtual stylus or touch. According to disclosed embodiments, analytic curves are defined as a series of points which follow the ink and snap to guide edge 204 if within a defined tolerance, but cannot reside within the area of the tool body. According to embodiments, analytic curves may be created by a stylus or touch interaction. A virtual stylus controlled by motion gesture may be utilized to create analytic curves.

Figure 3:
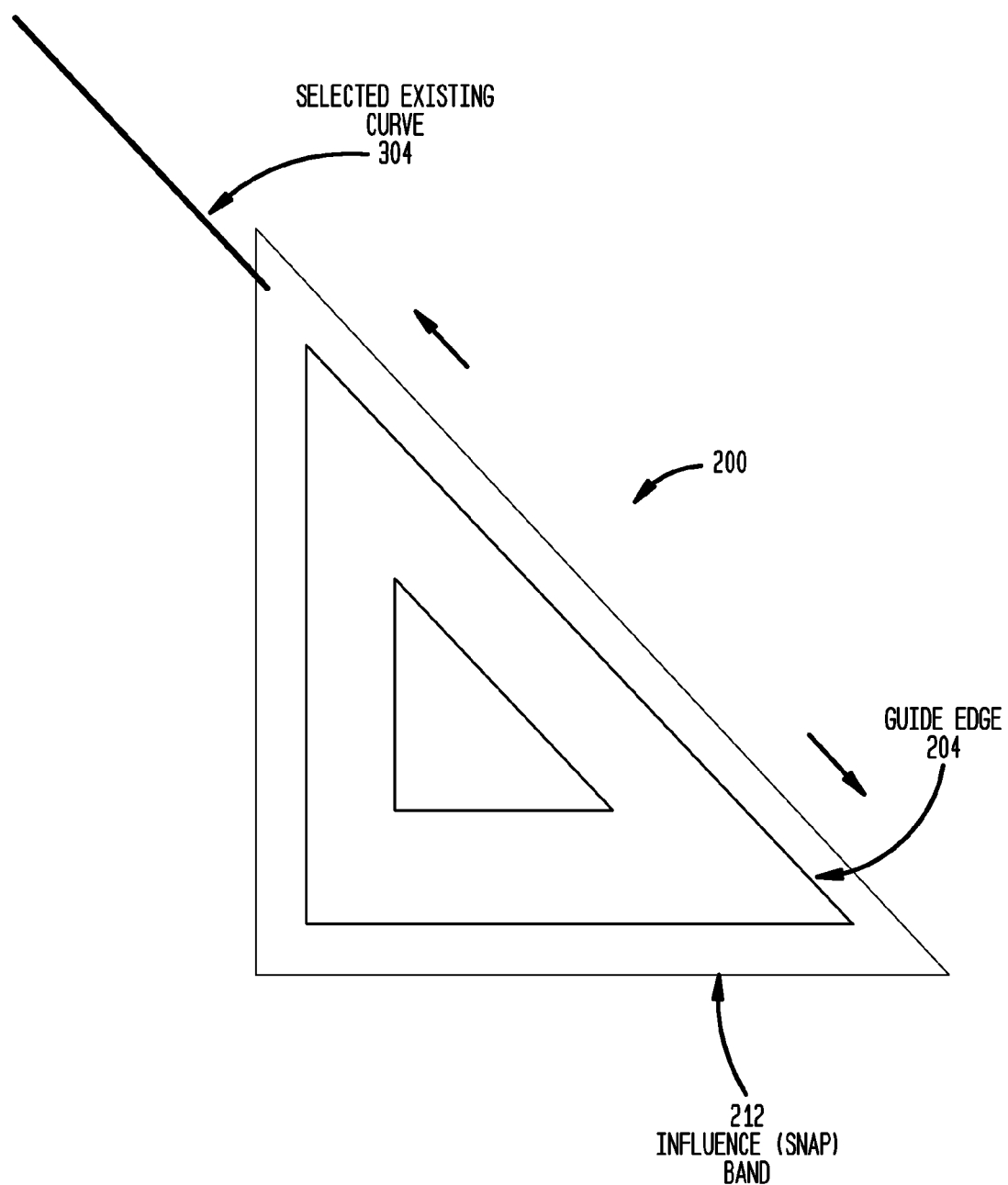
FIG. 3 illustrates a guide edge according to disclosed embodiments.

According to disclosed embodiments, guide edge 204 may be associatively aligned or constrained to existing goemetry (curve 304) as shown in FIG. 3 to enable constrained curve creation or tool alignment for subsequent operations. The guide edge follows the existing geometry as if it was a guide edge.

Figure 4:
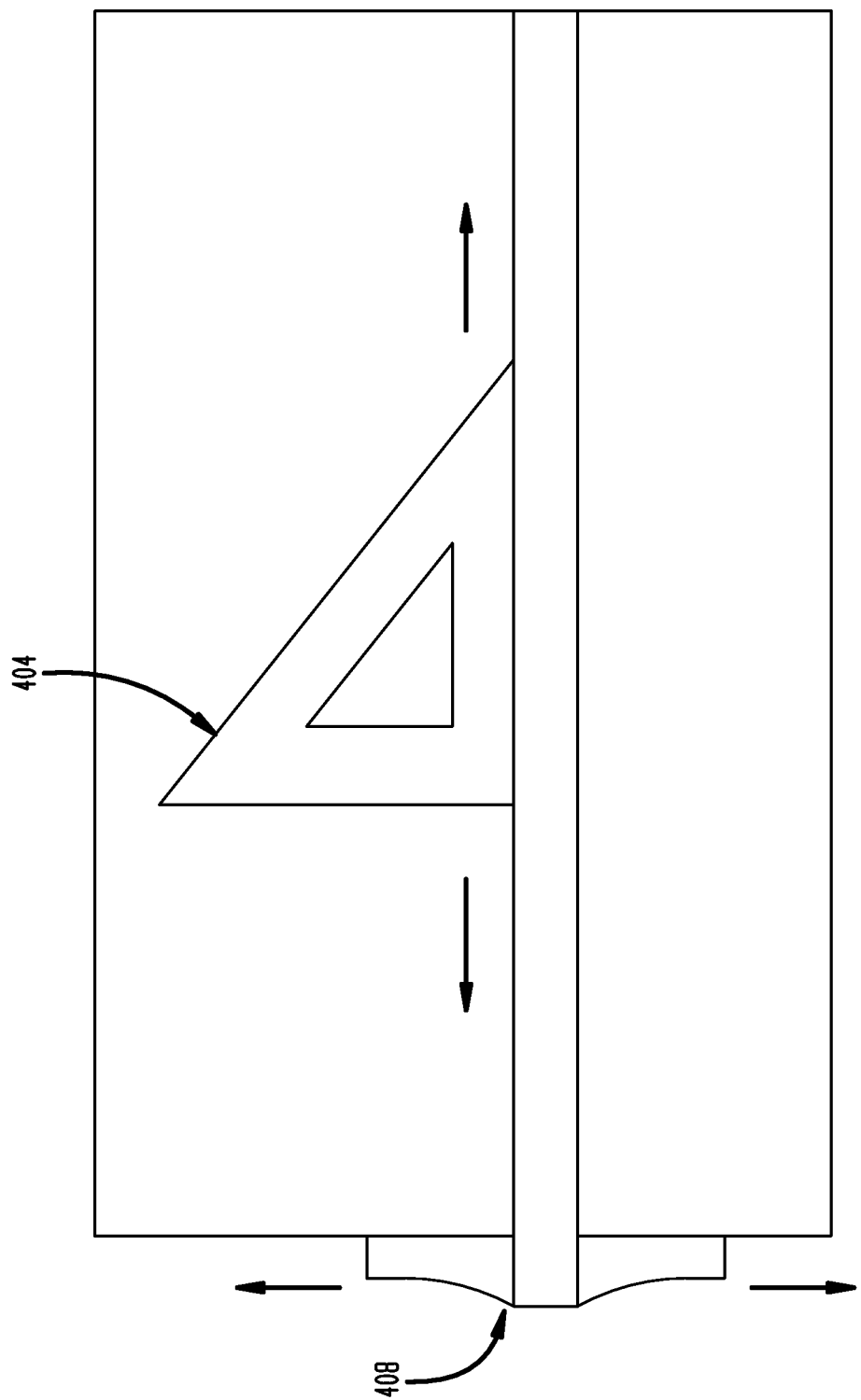
FIG. 4 illustrates snap features according to disclosed embodiments.

Tool Snapping: According to disclosed embodiments, guide curves are used to define the behavior and interaction of adjacent tools. According to embodiments, a tool's guide edge may "snap" within a pre-defined tolerance to an adjacent tool's guide edge. FIG. 4 illustrates triangle 404 whose guide edge (not shown in FIG. 4) may snap to the guide edge (not shown in FIG. 4) of T-Square 408. According to embodiments, the snap interaction is defined by a collinearity constraint or tangent and a sliding degree of freedom along the edges or tangent to the edges. The snap interaction allows the tools to interact in a manner similar to their physical counterparts. A user may move the tools using touch interaction as would be done with the tools physical counterpart and the inferred constraints will be maintained. The user may break the constraints by moving the tool in an exaggerated manner which violates the constraint. For instance, in FIG. 4 if the user rotates triangle 404 by a small amount, it springs back to honor collinearity with T-square 408's edge. However, if the rotational movement of triangle 404 is greater than predetermined thresholds (e.g., angle, velocity, and acceleration), triangle 404 breaks free of its constraint to T-square 408, and a user may use triangle 404 independently, or snap triangle 404 to some other tool's guide edges.

Virtual Drafting Board or Table: According to disclosed embodiments, virtual drafting boards or tables are provided on which a user may create a geometric model of an object using virtual drafting tools such as, for example, T-Squares, Triangles, Protractors, Drafting Machines, etc. According to embodiments, a virtual drafting tool may be positioned on a virtual drafting board or table and a virtual marking device (e.g., virtual pen) may be used to draw lines or curves on the virtual drafting board. The virtual drafting tools may be interacted tactically by a pointer device or mouse. Also, the virtual drafting tools may be manipulated (e.g., moved) on the virtual drafting board by touch interaction. Thus, the disclosed embodiments provide advantages of a CAD system while recreating the experience of traditional physical drafting tools such as touch interaction and manipulation. According to disclosed embodiments, virtual documents may be associated to a virtual drafting board and fixed in place in relation to the virtual drafting board by a virtual drafting tape. The height and width of the virtual drafting board may be adjusted using touch gestures or by a pointing device such as a mouse. The aspect ratio of the drafting board may be locked. As discussed before, the use of a virtual drafting board is optional, and is not necessary to create a drawing.

Virtual Paper: According to disclosed embodiments, a virtual paper is a virtual canvas which may be repositioned within the virtual environment. The virtual paper may be attached to virtual drafting boards and other objects, in which case the virtual paper remains stationary relative to the underlying object and follows the underlying object through any of its transformations.

Figure 5:
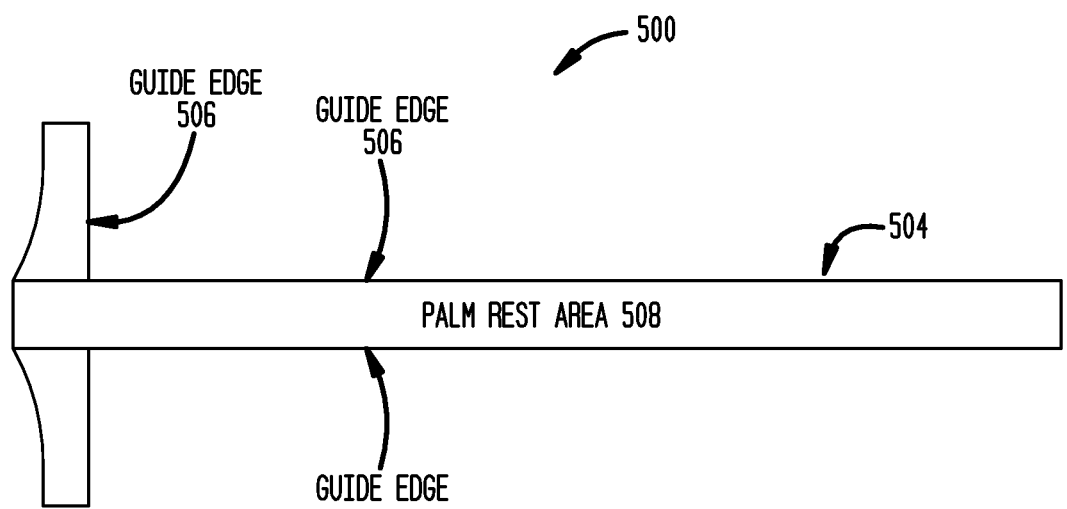
FIG. 5 illustrates a virtual drafting tool according to disclosed embodiments.

Virtual T-Square: FIG. 5 illustrates virtual T-Square 500 according to disclosed embodiments. Virtual T-Square 500 provides a horizontal reference 504 and an edge for alignment of other tools. Virtual T-Square 500 includes guide edges 506 and palm rest area 508. Virtual T-Square 500 also provides a mechanism for palm rejection when using a touch interface. The virtual T-Square may attach to a virtual page and to other tools.

Figure 6B:
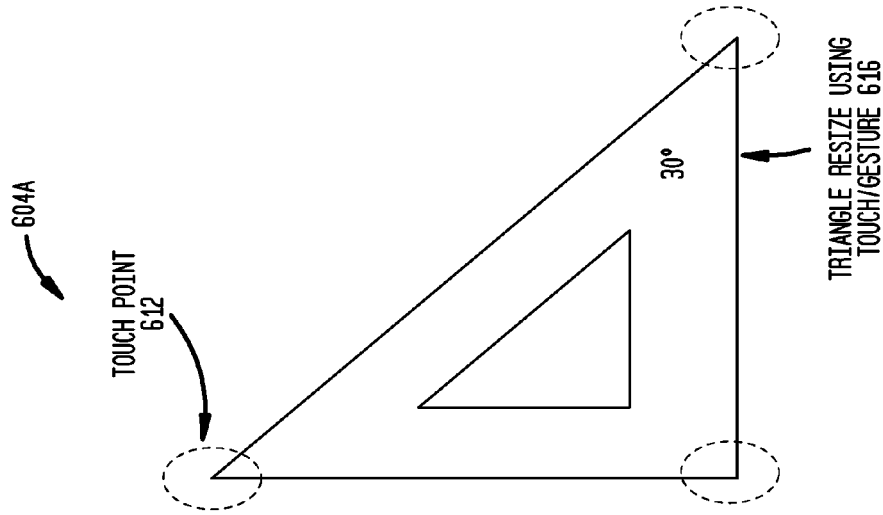
FIGS. 6A and 6B illustrate virtual drafting tools according to disclosed embodiments.
Figure 6A:
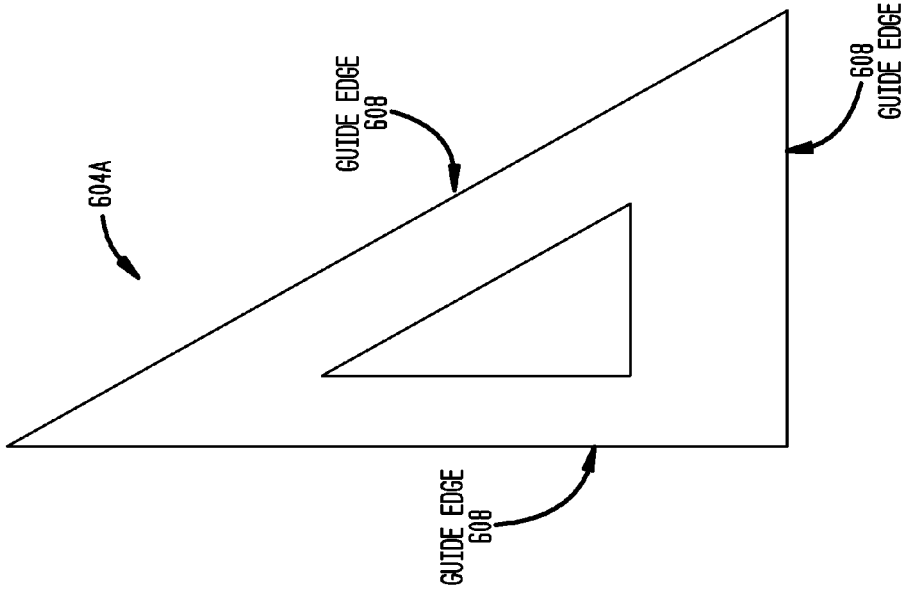

Virtual Triangle: FIGS. 6A and 6B illustrate virtual triangles 604A and 604B, respectively, according to disclosed embodiments. The virtual triangles provide a fixed angle relative to an edge or a reference tool. The triangles may have standard angles (e.g., 30°/60°/90°, 45°/45°/90°) or may be customized by the user. FIG. 6A shows guide edges 608 of the triangle. The angles and the size of the triangle may be modified as shown in FIG. 6B from touch points 612 using touch gestures 616. The angle may be set by selecting an existing linear curve to define the angle of a selected guide edge.

Figure 7:
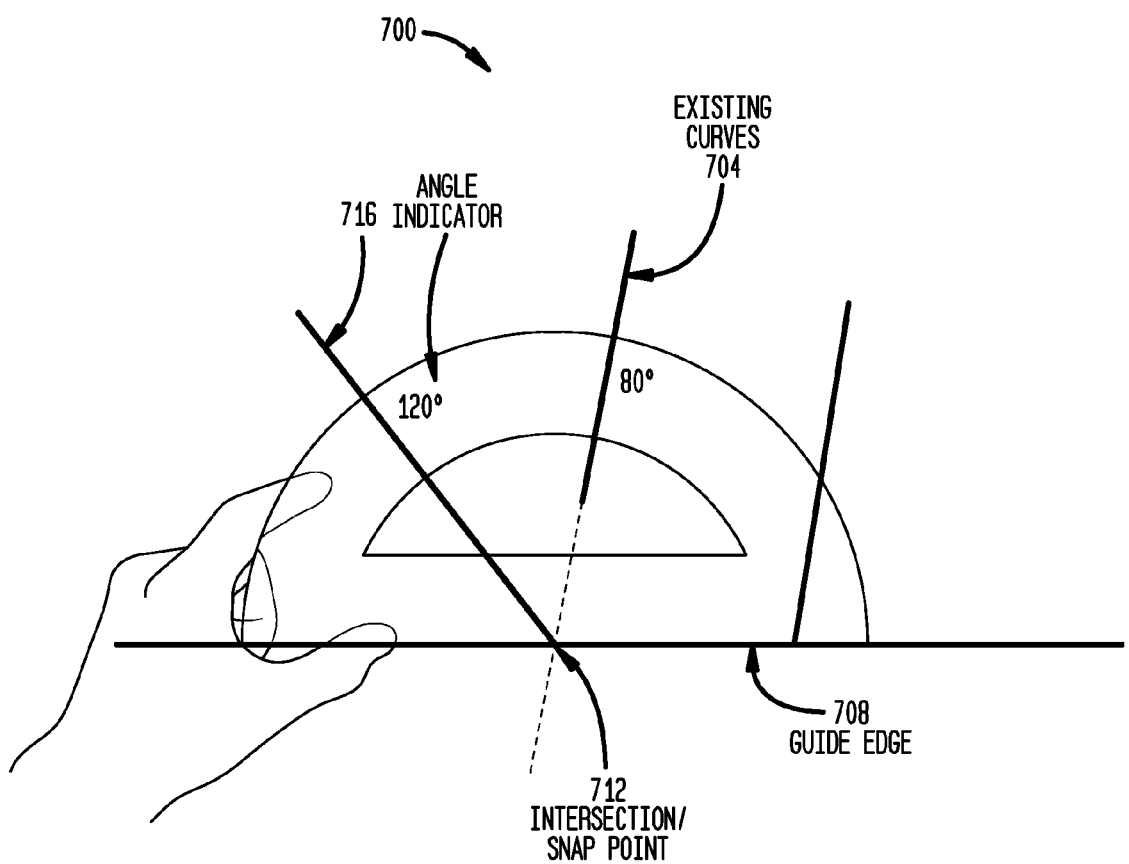
FIG. 7 illustrates a virtual drafting tool according to disclosed embodiments.

Virtual Protractor: FIG. 7 illustrates virtual protractor 700 according to disclosed embodiments. Virtual protractor 700 allows a user to measure the angle between existing curves 704 and the guide edge 708 of the protractor. According to disclosed embodiments, the virtual protractor's straight edge is guide edge 708. Guide edge 708 snaps to other guide edges and existing geometry. As the protractor's guide edge 708 is slid along a curve using a gesture, the origin of the protractor snaps to a vertex or point 712 defined by the virtual extension of an intersecting line 716. According to disclosed embodiments, when the protractor snaps to the point, the intersection of any line radiating from that point is highlighted along the periphery of the arced portion of the protractor, and the angle of that curve is presented to the user either on the protractor or elsewhere on the display. According to disclosed embodiments, a virtual goniometer protractor is provided, which combines the functionality of a triangle and a protractor.

Virtual Drafting Machine: According to disclosed embodiments, virtual drafting machine mimics interaction of a physical machine and provides adjustments of a physical drafting machine.

Virtual Compass and Divider: According to disclosed embodiments, a virtual compass and a divider allow a user to sweep arcs relative to a point or endpoints. Also, the virtual compass and the divider allow a designer to capture distances for replication. According to disclosed embodiments, a user may touch one point of the virtual compass to lock it as the point of rotation and use a gesture to sweep an arc under the other point. According to disclosed embodiments, the virtual divider is adjustable in the same manner as the virtual compass, but does not create any geometry. Rather, the user sets the virtual divider to a prescribed radius or locks it to a radius based on existing geometry (e.g., distance between two points), then transfers the distance across the page, optionally marking points along the way. According to disclosed embodiments, the virtual divider may record the total distance accumulated through each step. According to disclosed embodiments, the virtual compass and the divider may be used in interaction with digital maps for navigational purposes.

Figure 8:
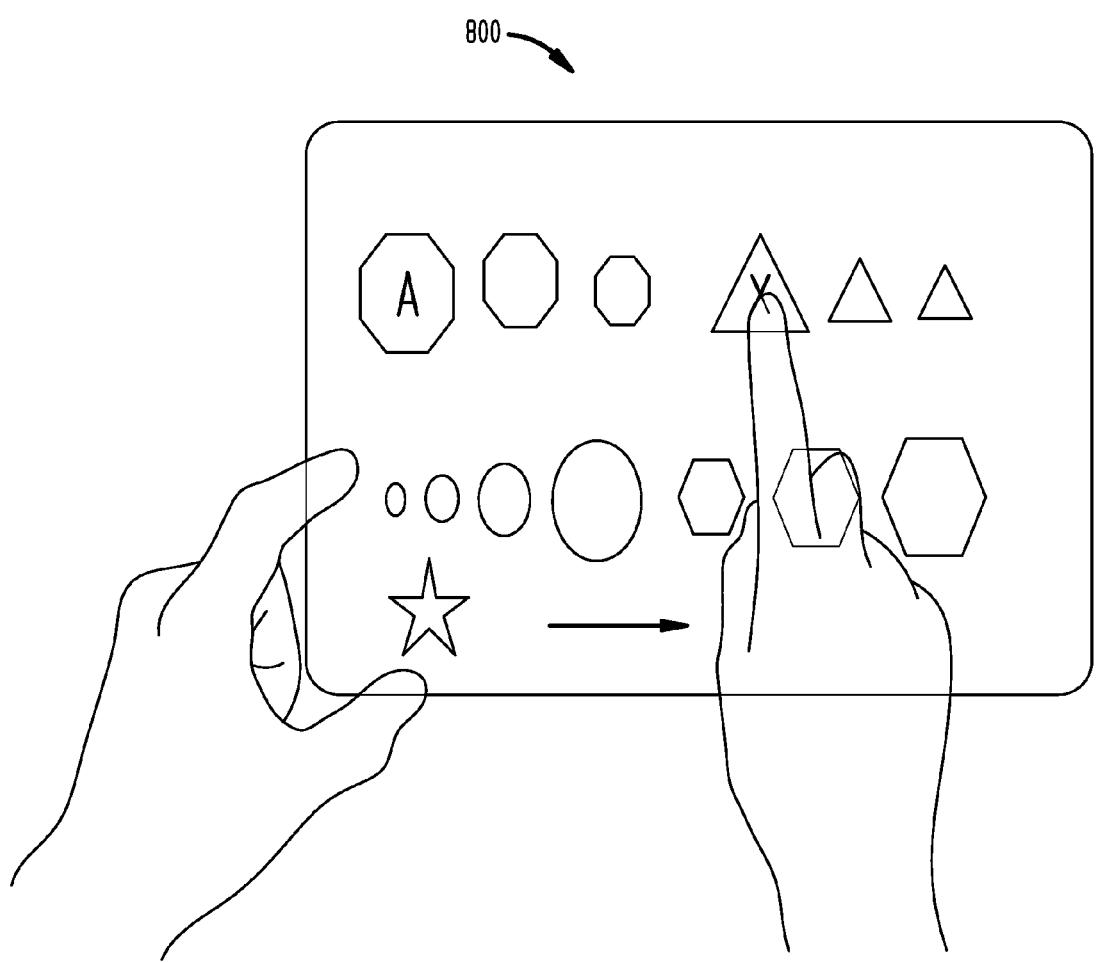
FIG. 8 illustrates a virtual drafting tool according to disclosed embodiments.

Virtual Symbol Template: FIG. 8 illustrates virtual symbol template 800 according to disclosed embodiments. Virtual Symbol Template 800 allows a designer to create, manage, and use symbols. As shown in FIG. 8, a standard set of templates are provided which correspond to commercially available templates. The templates may include commonly used shapes and drafting standards. The shapes may be added to a document by a "stamp" process or by a tracing operation. Rather than drawing a shape or selecting an icon, a designer may manipulate a virtual template to "stamp" a desired shape on a document.

Virtual Triangular Scale: According to disclosed embodiments, a virtual triangular scale is provided to measure the length of a linear curve or the distance between two points. The user may "rotate" the scale to a different face, and therefore a different reference scale, using a touch gesture. The user may modify the scale of edge on the tool to conform to the scale of drawing view by selecting a known reference length in the view. A user may customize and manage the scale for commonly used measurements.

Figure 9A:
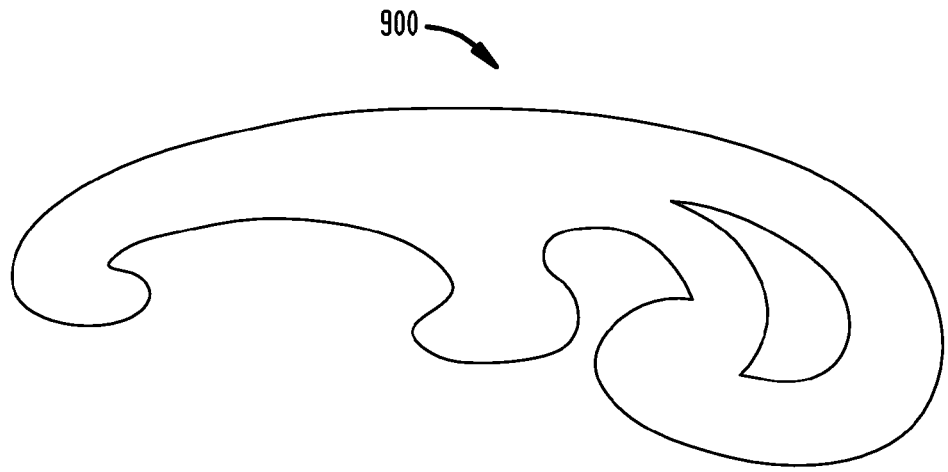
FIGS. 9A, 9B and 9C illustrate virtual drafting tools and use thereof according to disclosed embodiments.
Figure 9B:
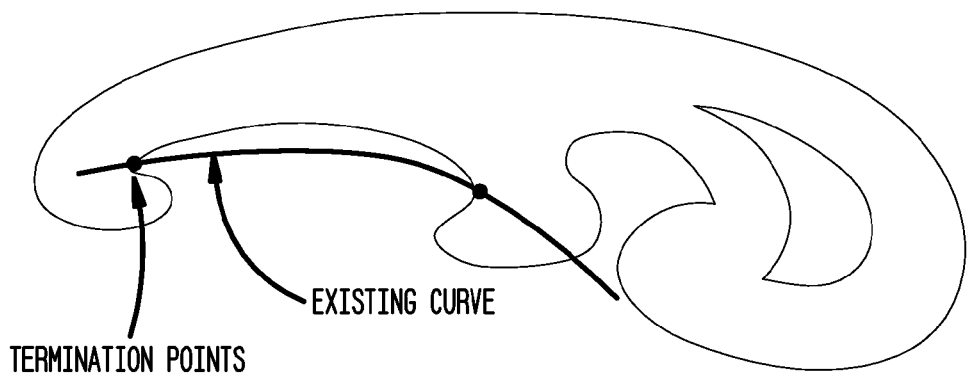
Figure 9C:
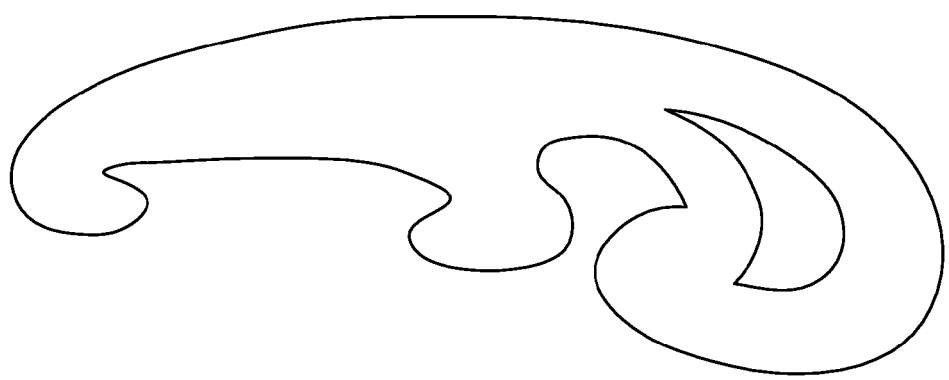

Virtual French Curve: FIG. 9A illustrates virtual french curve 900 according to disclosed embodiments. A designer may modify the profile of a virtual french curve to achieve a desired spline shape. Also, a designer may adopt an existing curve by selecting an existing curve and termination points as shown in FIG. 9B. A designer may create and manage a custom french curve for commonly used splines as shown in FIG. 9C. According to disclosed embodiments, reference points may be added along the edge of a french curve to enable the user to position the curve precisely.

Virtual Eraser Shield: FIG. 10 illustrates virtual eraser shield 1000 according to disclosed embodiments, which provides masked areas to ensure sharp edges on erased ink. A designer may create and manage custom eraser guides. According to disclosed embodiments, virtual eraser shield 1000 may be used with pixel eraser tools, in which case only the pixels within the guide area are available for erase, or may be used with stroke erase tools, in which case if a stroke segment is trimmed at any point the stroke intersects the edge of the guide area. A user may create and manage custom eraser shields by including standard shapes or by selecting a shape created by the user.

Figure 11:
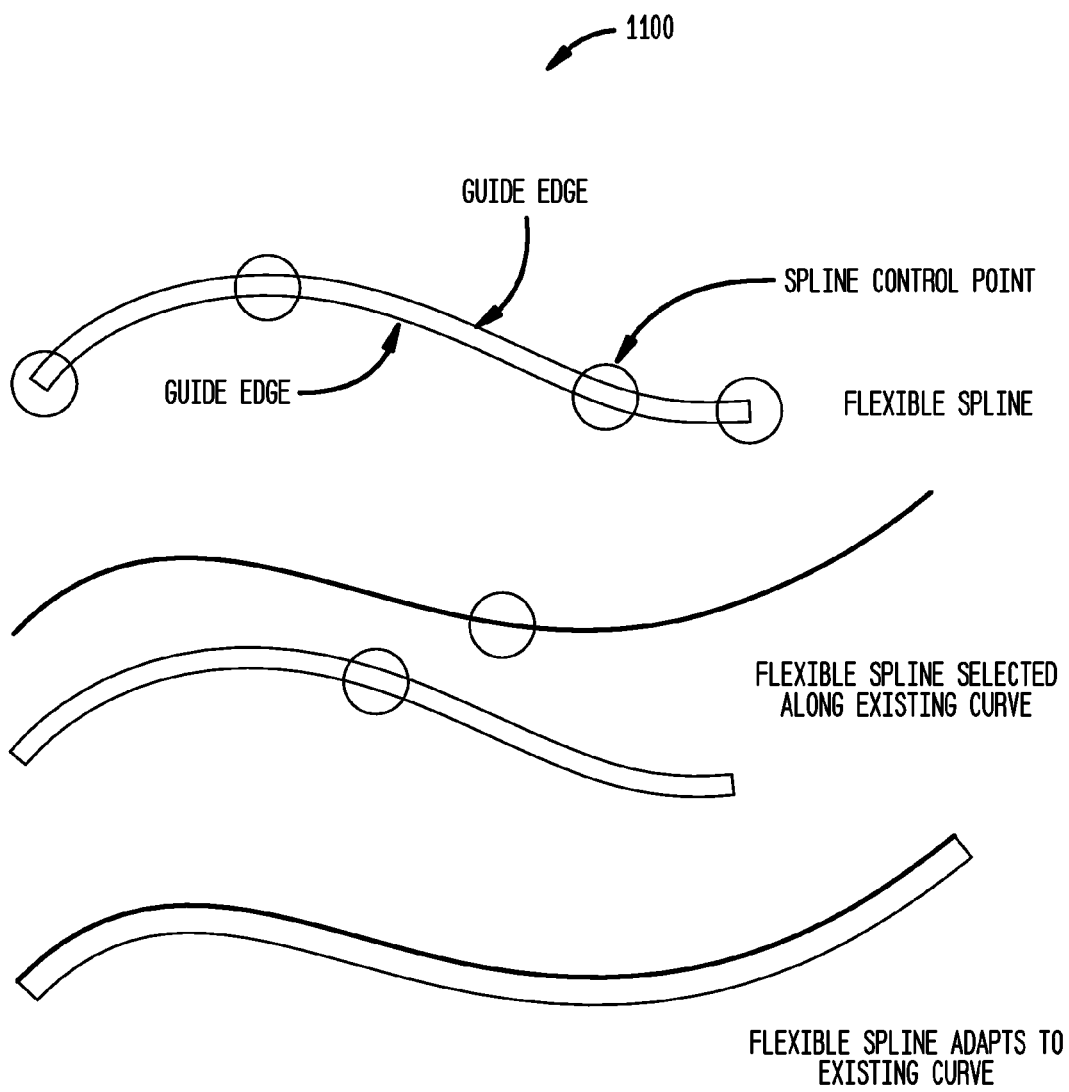
FIG. 11 illustrates virtual drafting tools and use thereof according to disclosed embodiments.

Virtual Flexible Spline: FIG. 11 illustrates virtual flexible spline 1100 according to disclosed embodiments. Virtual flexible spline 1100 allows a designer to create a persistent spline shape relative to a set of points prior to creating a spline curve on the page. The spline shape can subsequently be captured for re-use in a custom french curve. The flexible spline shape may be manipulated by selecting existing spline control points, or by adding or removing spline control points. According to disclosed embodiments, the flexible spline may be modified by selecting an existing curve which causes the flexible spline to adapt to the shape of the existing curve. The user may control the termination points (end points) of the flexible spline tool. The flexible spline shapes may be saved in the toolbox.

Figure 12:
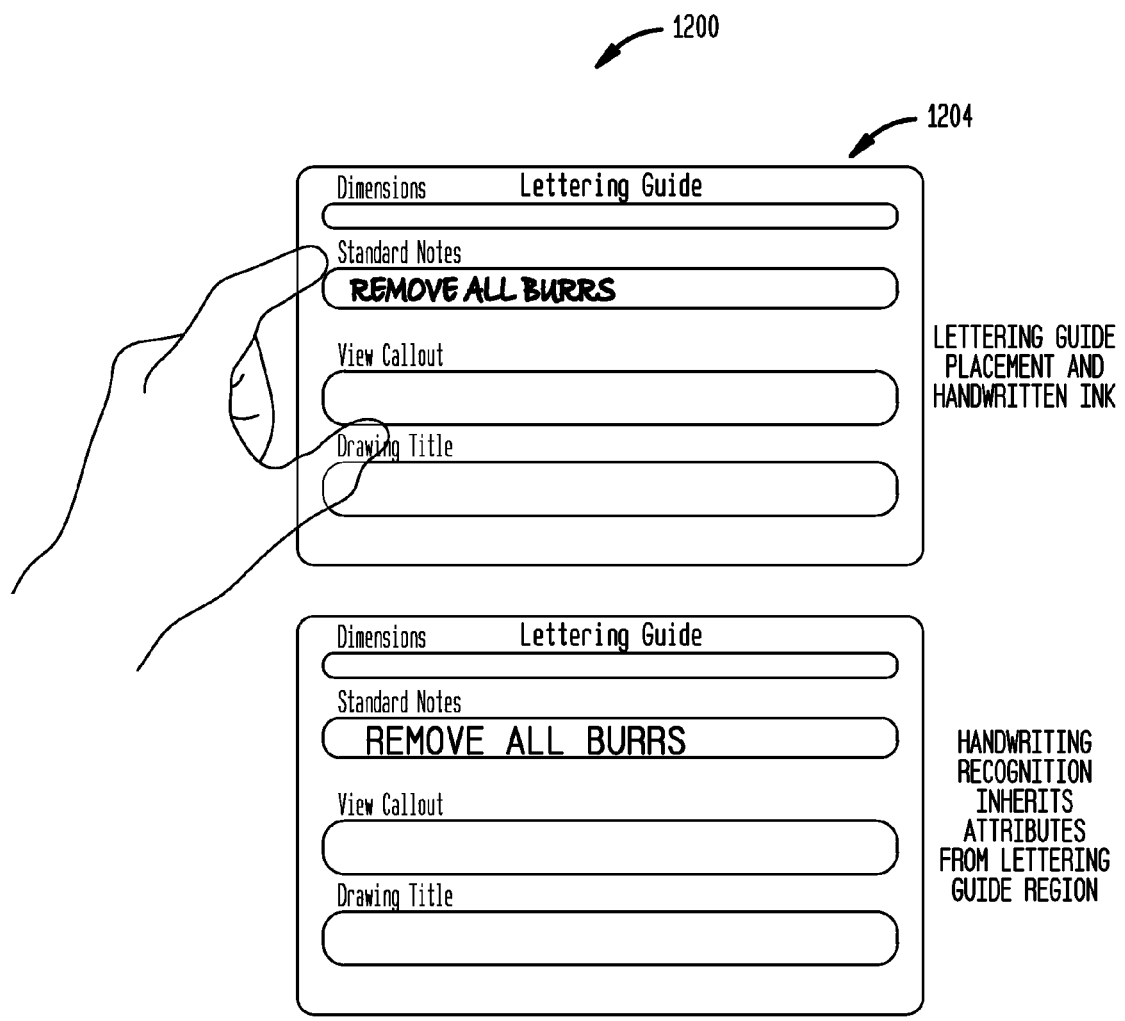
FIG. 12 illustrates a virtual drafting tool according to disclosed embodiments.

Virtual Lettering Guide: FIG. 12 illustrates virtual lettering guide 1200 according to disclosed embodiments. Virtual lettering guide 1200 allows a designer to select a font and text format. Virtual lettering guide 1200 may be operated in conjunction with handwriting recognition or keyboard (physical or virtual) entry. As shown in FIG. 12, multiple areas of virtual lettering guide 1200 provide differing font formats and spacing, enabling conformance to different standards. The virtual lettering guide may be customized by resizing, managing regions, and customizing region attributes to prescribe font information. According to disclosed embodiments, the outside edges of virtual lettering guide 1200 are guide edges 1204 which can snap to other tools or prescribed orientations (e.g., 0°, 45°, 90°, etc.).

Virtual Drafting Tape: According to disclosed embodiments, virtual drafting tape is provided to maintain a document on a selected position relative to a mounting surface such as, for example, a virtual drafting board or another document. When the virtual drafting Tape is used, the document cannot be moved without "removing" the tape. The virtual Drafting Tape is especially useful in a CAD environment in which multiple documents may be created and one document may be attached to the surface of another.

Virtual Cleaning Pads: According to disclosed embodiments, virtual cleaning pads are provided to remove visible erased line artifacts and eraser dust from a document.

Figure 13A:
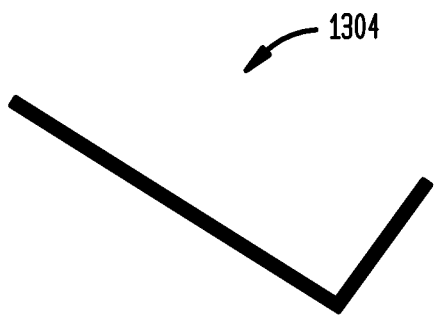
FIGS. 13A and 13B illustrate an original entity and virtual erased entity.
Figure 13B:
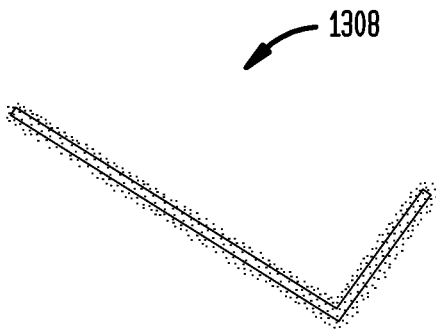

Virtual Erased Entity Visibility: According to disclosed embodiments, a virtual representation of a faint remainder of an erased entity remains on a document for future reference. FIG. 13A illustrates an original entity 1304 and FIG. 13B illustrates virtual erased entity 1308. Virtual erased entity 1308 may be provided with a digital representation of erased ink or graphite or may be provided with an indent or crease on a document. The erased lines or curves may be recovered by a designer if needed. According to disclosed embodiments, the erased lines or curves may fade over time, making more recently erased lines or curves more prevalent on a document. The erased lines or curves may optionally be used as reference entities for new geometry creation and the new entities can snap to erased entities. Selected erased entities may be permanently deleted by a cleaning pad, or other methods deemed suitable. According to disclosed embodiments, erased entities are retained. An erased entity has attributes (e.g., metadata), which enables filtering of erased data. The erased entities may be shown and restored by applying filters. Typical attributes of erased entities may, for example, include date and time created, date and time deleted, created by, deleted by, entity font, appearance, etc. Erased entities may be restored in any order regardless of when erased. According to some embodiments, there is no notion of a sequential restoration as is typical behavior of an "undo" function.

Virtual Eraser Dust: According to disclosed embodiments, a residual graphic representation of eraser dust is left on a document after erasing a line or a curve. The virtual eraser dust is dynamic in nature and may be moved or "blown off" the page by an inertial device input or gestures, or other sensor input, such as a microphone. According to disclosed embodiments, the virtual eraser dust is graphically represented to mimic the behavior of real eraser dust which follows the path of the eraser as the entity is erased.

Figure 14:
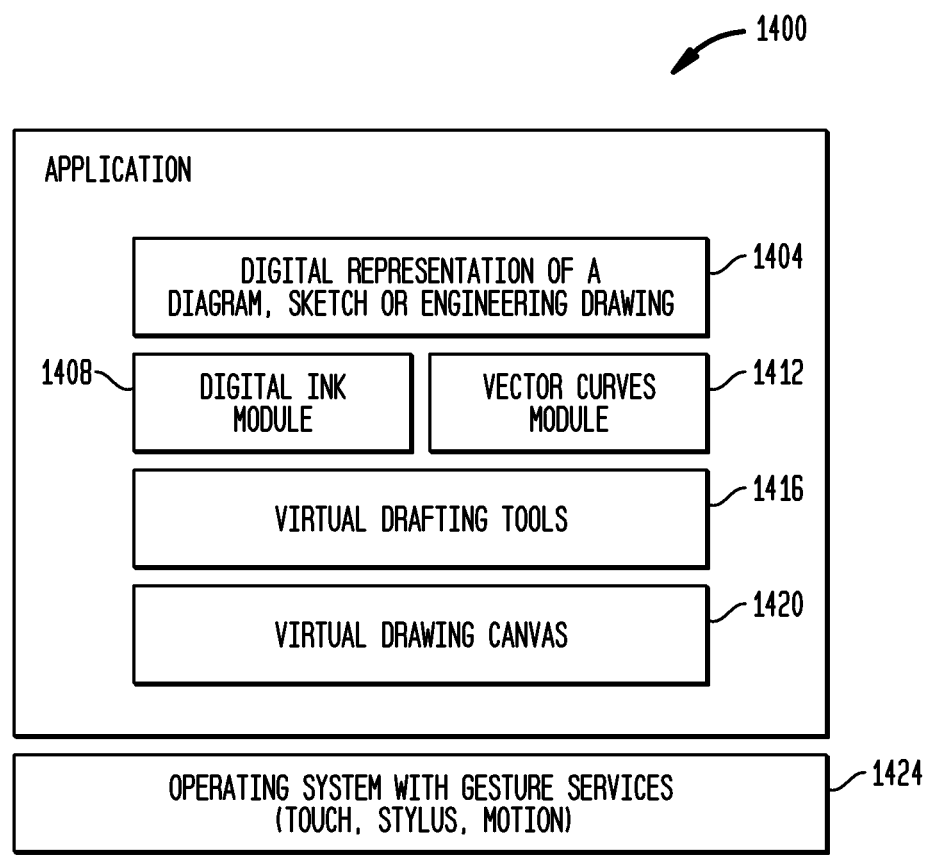
FIG. 14 illustrates a system block diagram according to disclosed embodiments.

FIG. 14 illustrates a block diagram of application 1400 including various modules according to disclosed embodiments. Application 1400 includes digital representation module 1404 which illustrates geometries created by a user using the virtual drafting tools. Application 1400 also includes digital ink module 1408 for laying down ink and module 1412 for generating analytic curves such as vector curves and others. Application 1400 also includes virtual drafting tools module 1416 which stores a plurality of virtual drafting tools. Application 1400 also includes virtual drawing canvas module 1420 for generating a virtual drawing canvas. Application 1400 communicates with external operating system 1424 which enables gesture services such as touch interaction, stylus operation, and motion gesture.

Figure 15:
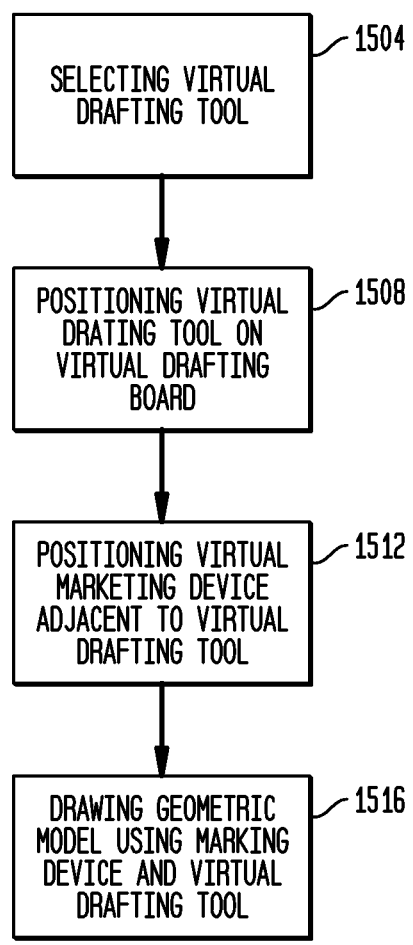
FIG. 15 is a flowchart of a process according to disclosed embodiments.

FIG. 15 is a flowchart of a process according to disclosed embodiments. Such a process can be performed, for example, by system 100 as described above, but the "system" in the process below can be any apparatus configured to perform a process as described herein. In block 1504, a user selects a virtual drafting tool using system 100. The user may select the virtual drafting tool from a plurality of available virtual drafting tools.

In block 1508, the user positions the virtual drafting tool on a document. The document may be a page, a virtual canvas, a virtual drafting board, or otherwise. The user may position the virtual drafting tool relative to another tool or relative to existing curves.

In block 1512, the user positions a virtual marking device relative to the virtual drafting tool. The virtual marking device may, for example, be a virtual pen or a stylus. In block 1516, the user draws a geometric model using the virtual marking device and the virtual drafting tool.

Figure 16:
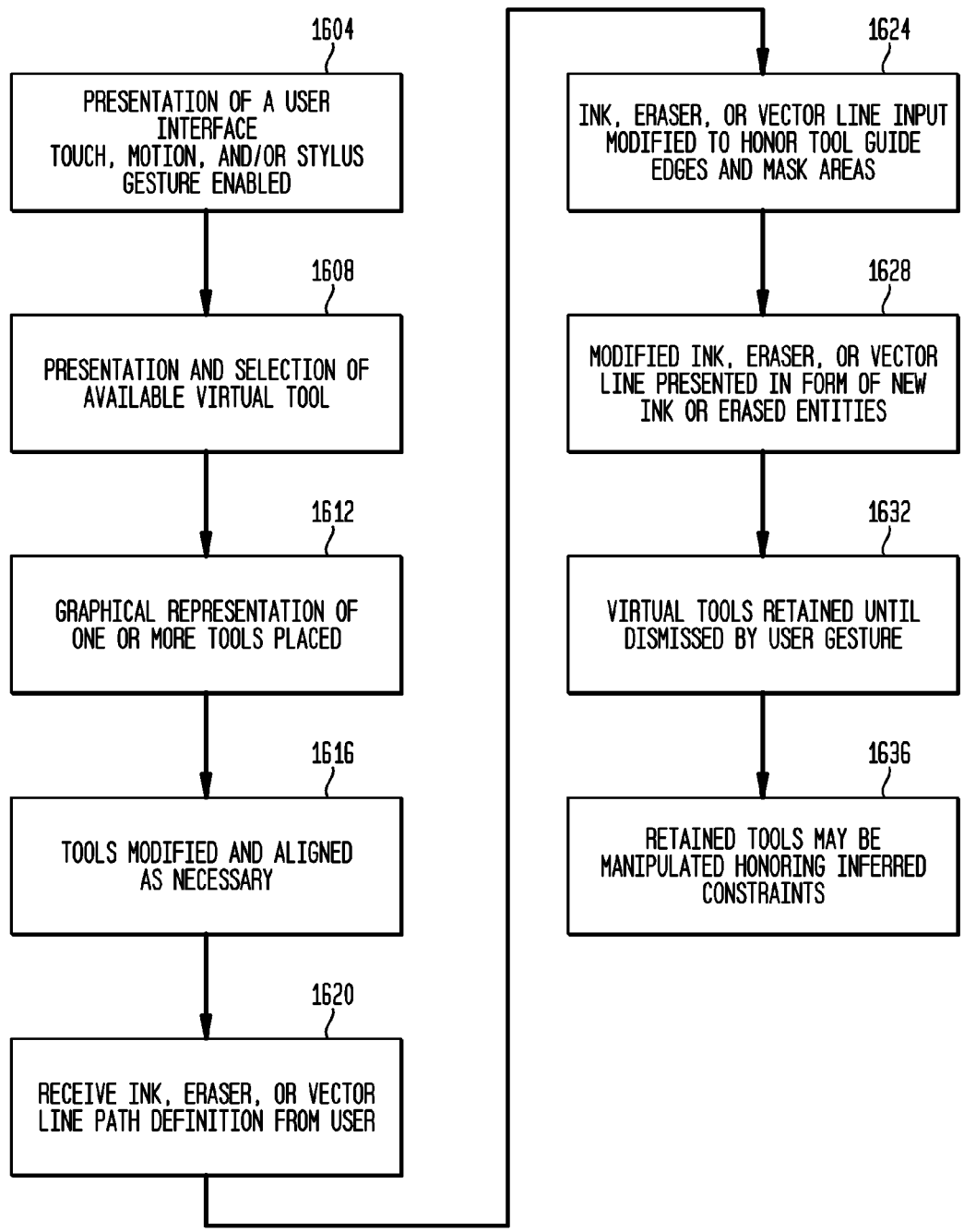
FIG. 16 is a flowchart of a process according to other disclosed embodiments.

FIG. 16 is a flowchart of a process according to other disclosed embodiments. Such a process can be performed, for example, by system 100 as described above, but the "system" in the process below can be any apparatus configured to perform a process as described herein. In block 1604, system 100 presents a user interface (UI) to a user. The UI enables touch, motion and/or stylus gestures.

In block 1608, system 100 presents available virtual drafting tools to the user. The user may select one or more tools from the available tools.

In block 1612, using system 100 the user positions a virtual drafting tool on a document. The document may be a page or a virtual canvas. The user may drag the tool using a mouse or by touch interaction.

In block 1616, the user may modify and align the virtual drafting tool, if necessary. In block 1620, system 100 receives ink, eraser or analytic curve from the user. In block 1624, system 100 modifies the ink, eraser or analytic curve in accordance with guide edges and mask areas.

In block 1628, system 100 presents the modified ink, eraser or vector line as a new entity. In block 1632, the user removes the virtual drafting tool by hand gesture. System 100 retains the virtual drafting tool until removed by the user.

In block 1636, system 100 may manipulate the virtual tool in accordance with constraints. For example, the virtual tool may snap to an adjacent tool.

According to disclosed embodiments, a non-transitory computer-readable medium is encoded with computer-executable instructions for creating a virtual geometric model. The computer-executable instructions, when executed, cause at least one data processing system to: generate a virtual drafting tool; generate a virtual marking device; position the virtual drafting tool relative to a canvas, a page, existing curves, or other virtual drafting tools; position the virtual marking device relative to the drafting tool; draw the geometric model by laying down ink by the virtual marking device using the virtual drafting tool; and store the geometric model in a memory.

Those skilled in the art will recognize that, for simplicity and clarity, the full structure and operation of all systems suitable for use with the present disclosure is not being depicted or described herein. Instead, only so much of a system as is unique to the present disclosure or necessary for an understanding of the present disclosure is depicted and described. The remainder of the construction and operation of the disclosed systems may conform to any of the various current implementations and practices known in the art.

Of course, those of skill in the art will recognize that, unless specifically indicated or required by the sequence of operations, certain steps in the processes described above may be omitted, performed concurrently or sequentially, or performed in a different order. Further, no component, element, or process should be considered essential to any specific claimed embodiment, and each of the components, elements, or processes can be combined in still other embodiments.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for creating a virtual geometric model using a computer aided design (CAD) system, comprising:
  positioning a virtual drafting tool;

positioning a virtual marking device relative to the virtual drafting tool;

creating a guide edge along the external edge of the virtual drafting tool;

creating a masked area bounded by the guide edge, wherein the virtual marking device is prevented from laying down ink under the masked area;

drawing the geometric model on a page by laying down ink by the virtual marking device using the virtual drafting tool; and storing the geometric model in a memory.

2. The method of claim 1, wherein the ink laid down by the virtual marking device follows the guide edge.

3. The method of claim 2, wherein the virtual marking device is prevented from erasing under the masked area.

4. The method of claim 2, further comprising creating an influence band within a predetermined distance from the guide edge, wherein the ink laid down in the influence band is modified to approximate an intended line or a curve.

5. The method of claim 2, wherein the virtual drafting tool's guide edge snaps to an adjacent tool's guide edge.

6. The method of claim 2, further comprising drawing a line by laying down ink collinearly from the guide edge.

7. The method of claim 2, further comprising drawing a line by laying down ink offset by a predetermined distance from the guide edge inside the influence band.

8. The method of claim 1, further comprising:
selecting the virtual marking device with a pointing device; and
manipulating the pointing device to manipulate the virtual marking device.

9. The method of claim 1, further comprising:
selecting the virtual drafting tool with a pointing device; and
manipulating the pointing device to manipulate the virtual drafting tool.

10. The method of claim 1, further comprising:
displaying a selection of virtual drafting tools to a user; and
receiving a corresponding user selection, wherein the selection of virtual drafting tools include a virtual T-Square, a virtual triangle, a virtual protractor, a virtual drafting machine, a virtual compass, a virtual symbol template, a virtual triangular scale, a virtual French curve, a virtual eraser shield, a virtual flexible spline, a virtual lettering guide and a virtual drafting tape.

11. The method of claim 1, further comprising fixing a document on a selected position relative to the virtual drafting board using virtual drafting tape, wherein the document cannot be moved without removing the tape.

12. The method of claim 1, wherein a graphical representation of erased ink remains on a page.

13. The method of claim 1, wherein a residual graphical representation of eraser dust is left on a page after erasing a line or a curve.

14. A data processing system for creating a virtual geometric model of an object, comprising:
at least one processor; and
a memory connected to the processor, the data processing system configured to:
generate a virtual drafting tool;
generate a virtual marking device;
position the virtual drafting tool on a page;
position the virtual marking device relative to the virtual drafting tool;
create a guide edge along the external edge of the virtual drafting tool;
create a masked area bounded by the guide edge, wherein the virtual marking device is prevented from laying down ink under the masked area;
draw the geometric model by laying down ink by the virtual marking device using the virtual drafting tool; and
store the geometric model in the memory.

15. The data processing system of claim 14, wherein the ink laid down by the virtual marking device follows the guide edge.

16. The data processing system of claim 15, wherein the virtual marking device is prevented from erasing under the masked area.

17. The data processing system of claim 15, further comprising an influence band within a predetermined distance from the guide edge, wherein the ink laid down in the influence band is modified to approximate an intended line or a curve.

18. The data processing system of claim 15, wherein the virtual drafting tool's guide edge snaps to an adjacent tool's guide edge.

19. The data processing system of claim 14, further comprising a virtual drafting tape to maintain a document on a selected position relative to the virtual drafting board, wherein the document cannot be moved without removing the tape.

20. The data processing system of claim 14, further comprising a graphical representation of an erased line on a page.

21. The data processing system of claim 14, wherein a residual graphical representation of eraser dust is left on a page after erasing a line or a curve.

22. The data processing system of claim 14, further configured to:
display a selection of virtual drafting tools to a user; and
receive a corresponding user selection, wherein the selection of virtual drafting tools include a virtual T-Square, a virtual triangle, a virtual protractor, a virtual drafting machine, a virtual compass, a virtual symbol template, a virtual triangular scale, a virtual French curve, a virtual eraser shield, a virtual flexible spline, a virtual lettering guide and a virtual drafting tape.

23. A non-transitory computer-readable medium encoded with computer-executable instructions for creating a virtual geometric model of an object, wherein the computer-executable instructions, when executed, cause at least one data processing system to:
generate a virtual drafting tool;
generate a virtual marking device;
position the virtual drafting tool on a page;
position the virtual marking device relative to the virtual drafting tool;
create a guide edge along the external edge of the virtual drafting tool;
create a masked area bounded by the guide edge, wherein the virtual marking device is prevented from laying down ink under the masked area;
draw the geometric model by laying down ink by the virtual marking device using the virtual drafting tool; and
store the geometric model in a memory.

* * * * *